(12) United States Patent
Zhang et al.

(10) Patent No.: US 9,553,147 B2
(45) Date of Patent: *Jan. 24, 2017

(54) TRENCH FORMATION WITH CD LESS THAN 10NM FOR REPLACEMENT FIN GROWTH

(71) Applicant: Applied Materials, Inc., Santa Clara, CA (US)

(72) Inventors: Ying Zhang, Santa Clara, CA (US); Hua Chung, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/673,033

(22) Filed: Mar. 30, 2015

(65) Prior Publication Data
US 2016/0013273 A1    Jan. 14, 2016

Related U.S. Application Data

(63) Continuation of application No. 14/045,467, filed on Oct. 3, 2013, now Pat. No. 8,993,419.

(51) Int. Cl.
| | |
|---|---|
| *H01L 21/302* | (2006.01) |
| *H01L 29/10* | (2006.01) |
| *H01L 29/66* | (2006.01) |
| *H01L 21/02* | (2006.01) |
| *H01L 21/265* | (2006.01) |
| *H01L 21/3105* | (2006.01) |
| *H01L 21/311* | (2006.01) |

(52) U.S. Cl.
CPC ..... *H01L 29/1037* (2013.01); *H01L 21/02538* (2013.01); *H01L 21/265* (2013.01); *H01L 21/31055* (2013.01); *H01L 21/31111* (2013.01); *H01L 21/31144* (2013.01); *H01L 29/66795* (2013.01)

(58) Field of Classification Search
CPC ............... H01L 29/66795; H01L 29/66803; H01L 29/6681; H01L 29/66818
USPC ...................................................... 438/478
See application file for complete search history.

(56) References Cited

U.S. PATENT DOCUMENTS

| | | |
|---|---|---|
| 7,989,307 B2 | 8/2011 | Parekh et al. |
| 2013/0224945 A1* | 8/2013 | Liu ................ H01L 29/66795 438/595 |

* cited by examiner

*Primary Examiner* — Daniel Shook
(74) *Attorney, Agent, or Firm* — Patterson & Sheridan, LLP

(57) ABSTRACT

Embodiments described herein generally relate to methods of forming sub-10 nm node FinFETs. Various processing steps may be performed on a substrate to provide a trench over which a dielectric layer is conformally deposited. The dielectric layer is subsequently etched within the trench to expose the underlying substrate and a semiconductive material is deposited in the trench to form a fin structure. The processes of forming the trench, depositing the dielectric layer, and forming the fin structure can achieve sub-10 nm node dimensions and provide increasingly smaller FinFETs.

20 Claims, 7 Drawing Sheets

TRENCH FORMATION WITH CD LESS THAN 10NM FOR REPLACEMENT FIN GROWTH

CROSS-REFERENCE TO RELATED APPLICATIONS

This application is a continuation of and claims benefit to U.S. patent application Ser. No. 14/045,467, filed Oct. 3, 2013, the entirety of which is herein incorporated by reference.

BACKGROUND

Field

Embodiments described herein generally relate to a process for forming silicon fins in a FinFET structure. More specifically, embodiments described herein relate to trench formation with reduced critical dimensions (CD) for replacement fin growth.

Description of the Related Art

In response to an increased need for smaller electronic devices with denser circuits, devices with three dimensional (3D) structures have been developed. An example of such devices may include FinFETs having conductive fin-like structures that are raised vertically above a horizontally extending substrate. Conventional FinFETs may be formed on a substrate, such as a semiconducting substrate or silicon-on-insulator. The substrate may comprise a semiconducting substrate and an oxide layer disposed on the semiconducting substrate.

When manufacturing FinFETs, it is desirable to have a fin structure with a high aspect ratio. A higher aspect ratio for the fin structure allows a larger amount of current to be provided through the same amount of topographical area. Fabrication of high aspect ratio FinFETs is difficult as a result of the reduced critical dimensions required for sub-10 nm nodes. The reduced critical dimensions create challenges in forming trenches and other features which are required to form FinFETs.

Thus, there is a need in the art for methods of forming sub-10 nm node FinFETs.

SUMMARY

Embodiments described herein generally relate to methods of forming sub-10 nm node FinFETs. Various processing steps may be performed on a substrate to provide a trench over which a dielectric layer is conformally deposited. The dielectric layer is subsequently etched within the trench to expose the underlying substrate and a semiconductive material is deposited in the trench to form a fin structure. The processes of forming the trench, depositing the dielectric layer, and forming the fin structure can achieve sub-10 nm node dimensions and provide increasingly smaller FinFETs.

In one embodiment, a method of forming a semiconducting fin structure is provided. The method comprises etching a silicon layer to form a feature bounded by an insulator material. A dielectric layer is conformally deposited over the insulator material and the feature formed in the silicon layer. The dielectric layer is etched to expose a portion of the silicon layer within the feature through the dielectric layer and a semiconducting material is formed on the exposed portion of the silicon layer. The semiconducting material fills the feature between the dielectric layer, and then a portion of the dielectric layer, insulator material, and semiconducting material is removed to form a planar surface.

In another embodiment, a method of forming a semiconducting fin structure is provided. The method comprises etching a silicon layer to form a feature bounded by an oxide material, wherein the feature has an aspect ratio of between about 5:1 and about 30:1. A dielectric layer is conformally deposited over the oxide material and the feature formed in the silicon layer by an atomic layer deposition process. The dielectric layer is etched to expose a portion of the silicon layer within the feature through the dielectric layer and a material comprising silicon and germanium is formed on the exposed portion of the silicon layer. The silicon and germanium fills the feature between the dielectric layer and a portion of the dielectric layer, oxide material, and silicon and germanium is then removed to form a planar surface.

In yet another embodiment, a method of forming a semiconducting fin structure is provided. The method comprises etching a first region of a photoresist layer to expose a first region of a neutral layer and etching the exposed region of the neutral layer to expose a first region of a hardmask layer. The exposed region of the hardmask layer is etched to expose a first region of a silicon layer. A second region of the photoresist layer and a second region of the neutral layer are etched to expose a second region of the hardmask layer. The first region of the silicon layer is etched to form a trench and an insulator material is deposited in the trench. The second region of the hardmask layer and the insulator layer are planarized and ions are implanted into the silicon layer and the insulator material. The second region of the hardmask layer is etched to expose a second region of the silicon layer and a portion of the insulator material is etched to level the insulator material with the second region of the silicon layer. The second region of the silicon layer is etched to a depth of the implanted ion to expose insulator features and a dielectric layer is conformally deposited over the second region of the silicon layer and the insulator features. The dielectric layer is etched from a top portion of the insulator features and a portion of the second region of the silicon layer to form a regrowth region. A semiconducting material is deposited on the regrowth region to form a fin structure, wherein the dielectric layer is disposed between the fin structure and the insulator material. Finally, a portion of the dielectric layer, the insulator material, and the fin structure are removed to form a planar surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to methods of forming features for microelectronic devices. More specifically, methods described herein relate to methods of forming sub-10 nm node FinFETs. Trenches may be formed in an insulator material which is disposed over a silicon layer. A dielectric layer is conformally deposited over the insulator material and the silicon layer within the trenches. The dielectric layer narrows a width of the trenches and the dielectric layer is etched to expose a regrowth region on the silicon layer. A fin structure is grown from the regrowth region to form a FinFET structure. The method of forming the FinFET structure may provide for improved replacement fin growth for the sub-10 nm node.

Figure 1:
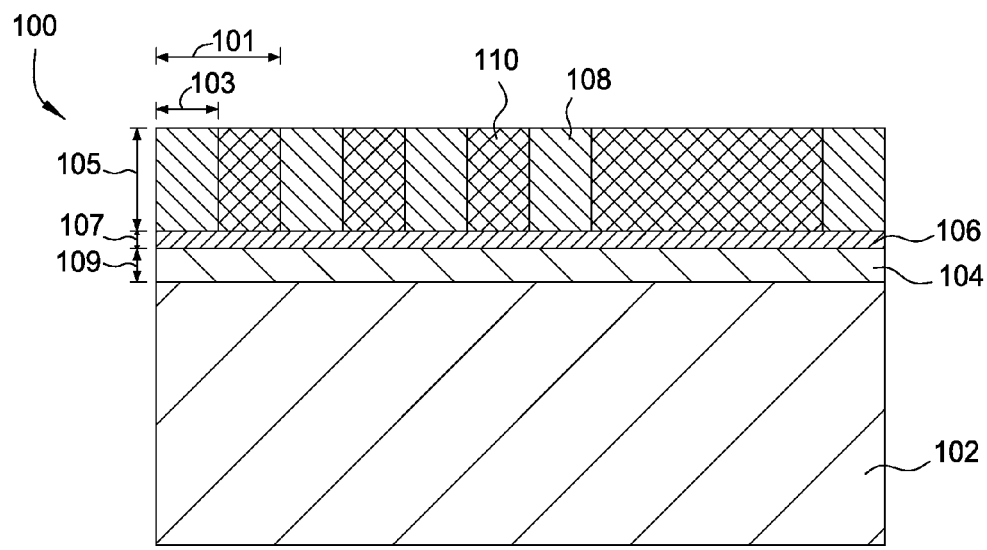
FIGS. 1-16 are cross-sectional views of a substrate illustrating a sequence of forming a FinFET structure according to one embodiment disclosed herein.

FIG. 1 is a cross-sectional view of a substrate 100 having various layers formed thereon. The substrate 100 comprises a silicon layer 102, hardmask layer 104, neutral layer 106, and a photoresist layer 108, 110. The silicon layer 102 comprises a monocrystalline silicon material which is either an intrinsic (un-doped) silicon material or an extrinsic (doped) silicon material. If an extrinsic silicon material is utilized, the dopant may be a p-type dopant, such as boron. The hardmask layer 104 is disposed over the silicon layer 102. In one example, the hardmask layer 104 comprises a silicon nitride material, however other hardmask layers which are capable of functioning as an etch stop may also be utilized. For example, depending upon pitch size and the lithography processes performed, more complex stack layers may be utilized as the hardmask layer 104. The hardmask layer 104 may have a thickness 109 of between about 20 nm and about 40 nm, such as about 30 nm. The neutral layer 106 is disposed over the hardmask layer 104 and may comprise an antireflective coating material such as silicon carbide. The neutral layer 106 has a thickness 107 of between about 2 nm and about 20 nm, such as about 8 nm.

The photoresist layer 108, 110 comprises at least two different materials. The first material 108 comprises polystyrene and the second material 110 comprises a polymer material. In one embodiment, the second material may be polystyrene-polymethylmethacrylate (PS-PMMA). In one embodiment, the first material 108 and the second material 110 are deposited by a spin-on coating process and separated into two different domains after an annealing process. The process of creating two different domains within the photoresist layer 108, 110 can proceed by directed self-assembly lithography. Both the first material 108 and the second material 110 have a thickness 105 of between about 30 nm and about 50 nm, such as about 40 nm, and a width 103 of between about 10 nm and about 30 nm, such as about 20 nm. Thus, a pitch 101 of the first material 108 and the second material 110 may be between about 20 nm and about 60 nm, such as about 40 nm. Although described as utilizing a directed self-assembly lithography process for forming the photoresist layer 108, 110, other processes such as 193 nm immersion lithography with self-aligned double photoresist, e-beam lithography, and extreme ultra-violet (EUV) lithography may also be utilized.

Figure 2:
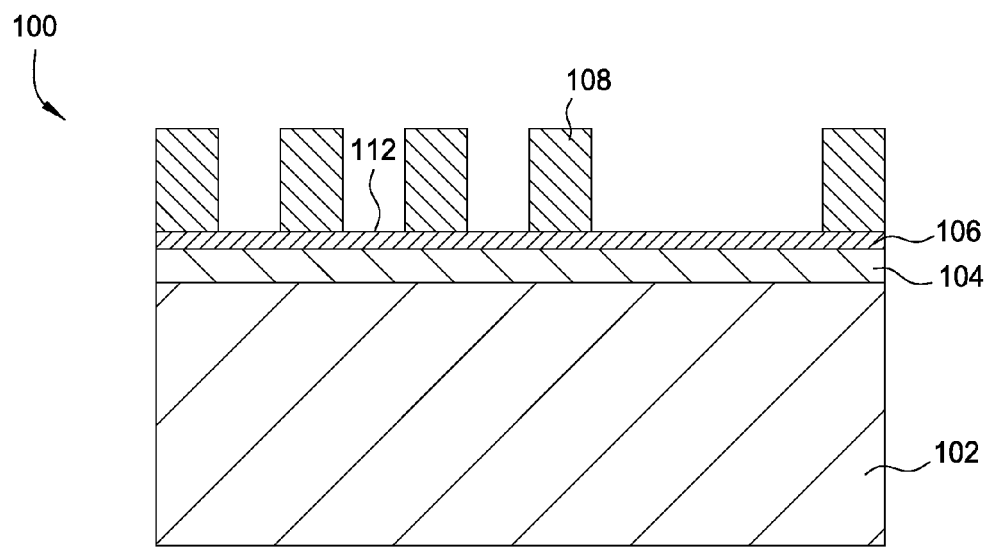

FIG. 2 is a cross-sectional view of the substrate 100 illustrating an etching process. An etch process is performed on the substrate 110 to selectively remove the second material 110. Removing the second material 110 forms an exposed region 112 of the neutral layer 106. The etch process may be either a wet etch or a dry etch. For example, a wet etching process may proceed by exposing the second material 110 to UV radiation having a wavelength of about 254 nm at a power of about 18 W/cm$^2$ for about 35 minutes. The UV exposure causes the second material 110 to degrade and the first material to undergo a crosslinking transformation. The substrate 100 is then rinsed in glacial acetic acid for about 35 min to remove the second material 110. Finally, the substrate is rinsed in deionized water for about 10 min to complete the removal of the second material 110.

In another example, a dry etching process utilizing an $O_2$ plasma may be performed to remove the second material 110. A $CO_2$ precursor gas is provided at a flow rate of about 400 sccm at subatmospheric pressure. The $CO_2$ may be energized into a plasma with an RF power of about 100 W and a bias of about 60 W and the etching process may proceed for about 25 seconds. One example of a chamber which may be utilized to perform the etching processes described here is the MESA™ etch chamber available from Applied Materials, Inc., Santa Clara, Calif. However, it is contemplated that other chambers from other manufacturers may also perform the processes described.

Figure 3:
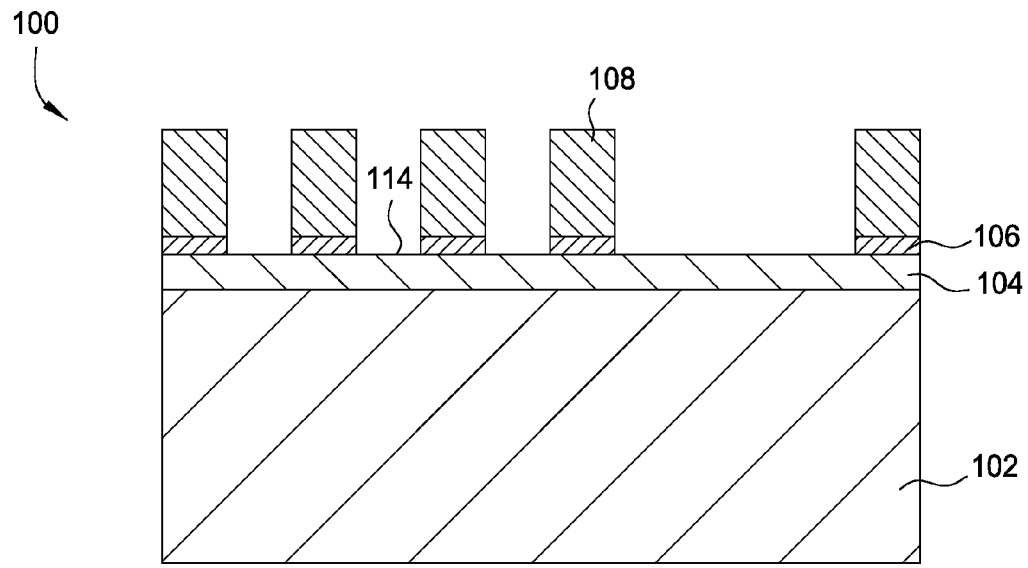

FIG. 3 is a cross-sectional view of the substrate 100 illustrating a neutral layer 106 removal process. The exposed region 112 of the neutral layer 106 is etched to remove a portion of the neutral layer 106. The removal of a portion of the neutral layer 106 creates an exposed region 114 of the hardmask layer 104, which may act as an etch stop in certain embodiments. In one example, the neutral layer 106 is etched utilizing a dry etch process. A $CF_4$ precursor gas may be flowed at a rate of about 100 sccm in an environment having a pressure of about 15 mT. The $CF_4$ may be energized into a plasma with an RF power of about 400 W and a bias of about 75 W and the etching process may proceed for about 35 seconds. As a result the neutral layer 106 is removed to expose the hardmask layer 104.

Figure 4:
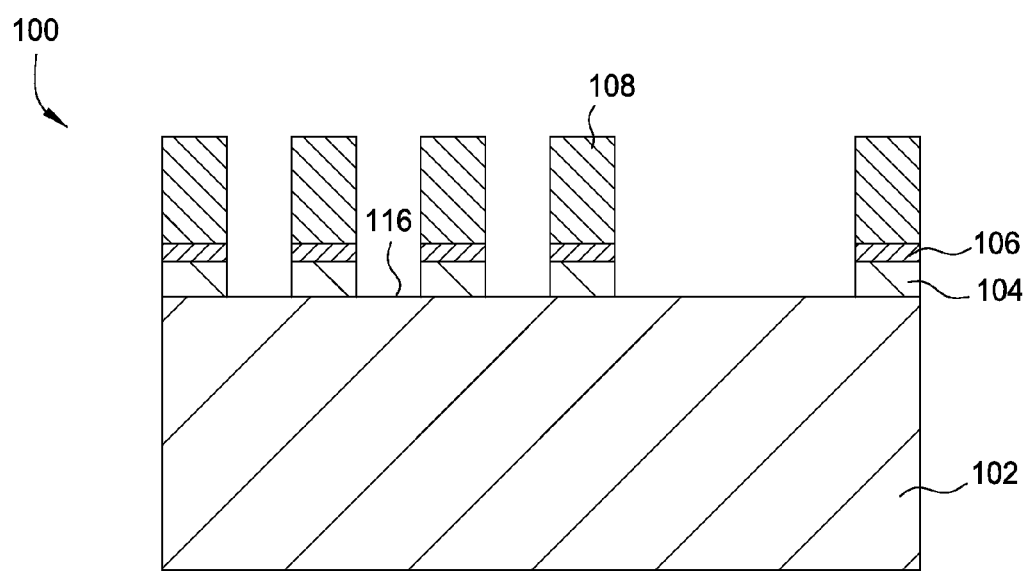

FIG. 4 is a cross-sectional view of the substrate 100 illustrating a hardmask layer 104 etching process. The exposed region 114 of the hardmask layer 104 is etched to remove a portion of the hardmask layer 104. The removal of a portion of the hardmask layer 104 creates an exposed region 116 of the silicon layer 102. In one example, the hardmask layer 104 is etched utilizing a dry etch process with a fluorine containing plasma. A $CF_4$ precursor gas and a $CHF_3$ precursor gas may be flowed at a rate of about 100 sccm and 150 sccm, respectively, in an environment having a pressure of about 4 mT. The $CF_4$ and $CHF_3$ may be energized into a plasma with an RF power of about 500 W and a bias of about 80 W and the etching process may proceed for about 40 seconds. As a result, the hardmask layer 104 is removed to expose the silicon layer 102.

Figure 5:
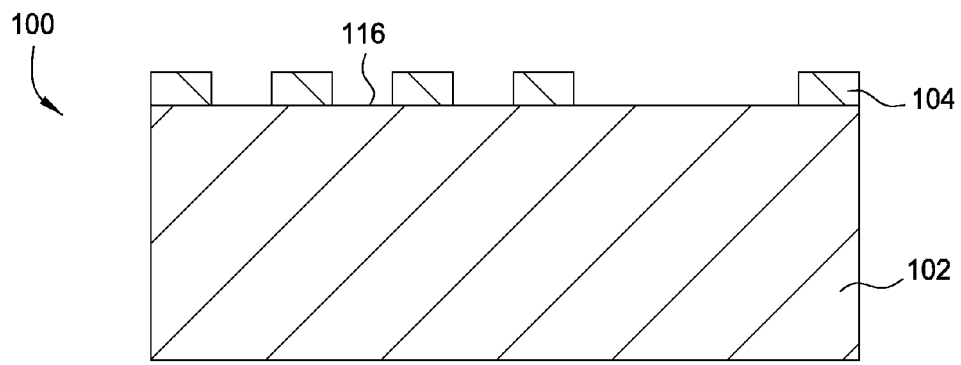

FIG. 5 is a cross-sectional view of the substrate 100 illustrating a photoresist stripping process. The first material 108 and the neutral layer 106 remaining under the first material 108 are etched to expose the hardmask layer 104. In one example, the first material 108 and the neural layer 106 are etched utilizing a dry etch process with an oxygen containing plasma. An $O_2$ precursor gas may be flowed at a rate of about 150 sccm in an environment having a pressure of about 10 mT. The $O_2$ may be energized into a plasma with an RF power of about 1000 W and a bias of about 50 W and the etching process may proceed for about 30 seconds. As a result, the first material 108 and the neutral layer 106 are removed to form a patterned hardmask layer 104 over the silicon layer 102.

Figure 6:
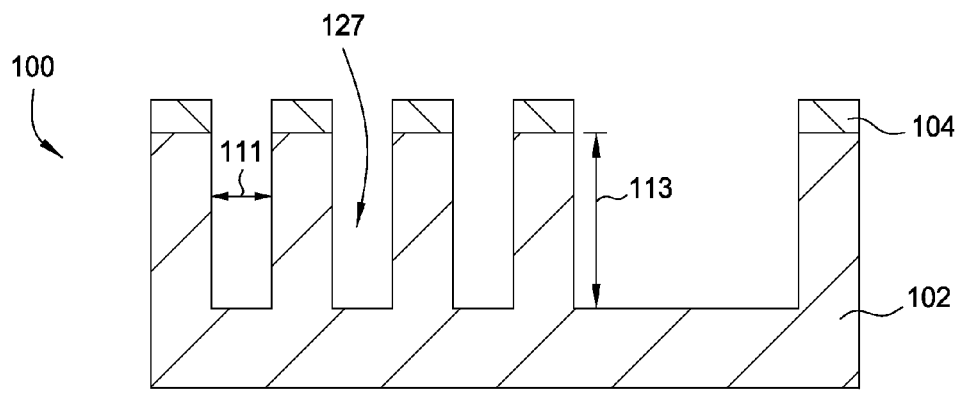

FIG. 6 is a cross-sectional view of the substrate 100 illustrating a silicon trench formation process. The exposed region 116 of the silicon layer 102 is etched to form a recess 127 in the silicon layer 102. The recess 127 may have a depth 113 of between about 30 nm and about 400 nm, such as about 150 nm, and a width 111 of between about 10 nm and about 30 nm, such as about 20 nm. In one example, the silicon layer 102 is etched utilizing a dry etch process with a chlorine containing plasma. A $CL_2$ precursor gas may be flowed at a rate of about 500 sccm in an environment having a pressure of about 7 mT. The $CL_2$ may be energized into a plasma with an RF power of about 1000 W and a bias of about 700 W and the etching process may proceed for about 45 seconds. As a result, recesses 127 are formed in the silicon layer 102.

Figure 7:
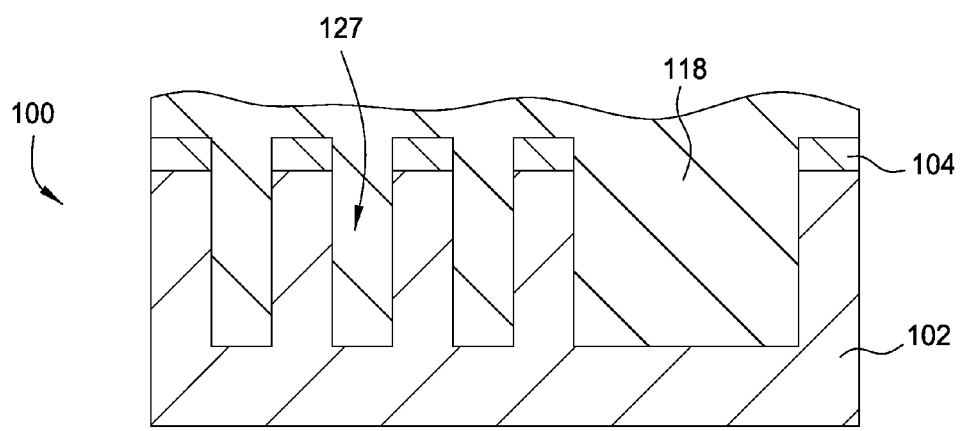

FIG. 7 is a cross-sectional view of the substrate 100 illustrating an insulator formation process. After the previously described silicon etching process is performed, an insulator layer 118 is deposited on the substrate 100. In one embodiment, the insulator layer 118 may be an oxide material. The insulator layer 118 is formed over the silicon layer 102 and the hardmask 104 by a flowable or a flow-like CVD process. The insulator layer 118 is typically formed in a blanket fashion, filling the recesses 127 of the silicon layer 102 and covering the raised portions of silicon layer 102 with the hardmask 104 disposed thereon.

In one example of a flowable CVD process, an organosilicon precursor and an oxygen precursor at a temperature of about 100° C. or less may be provided form a flowable oxide layer. Suitable organosilicon precursors have a ratio of carbon atoms to silicon atoms less than 8. Suitable organosilicon compounds may also have a ratio of oxygen to silicon atoms of 0 to about 6, and may include an Si—O—Si linkage that facilitates formation of $SiO_x$ films with reduced contamination from carbon and hydroxyl groups. Suitable oxygen precursors may include molecular oxygen ($O_2$), ozone ($O_3$), a nitrogen-oxygen compound such as NO, $NO_2$, or $N_2O$, a hydrogen-oxygen compound such as water or peroxide, a carbon-oxygen compound such as carbon monoxide or carbon dioxide, and other oxygen-containing precursors.

A carrier gas, for example, an inert gas, may also be provided with the organosilicon and oxygen precursors. The oxygen precursor may be activated prior to introduction to the chamber, for example using a remote plasma generator, which may include thermal dissociation, ultraviolet light dissociation, RF, DC, and/or microwave dissociation. In one embodiment, 4-6 kW of RF power may be coupled into a flow of 900-1,800 sccm of argon and 600-1,200 sccm of molecular oxygen. The organosilicon precursor may be provided to the chamber separately from the oxygen precursor to prevent reactions outside the chamber. The organosilicon precursor may be introduced as a gas to the chamber at a liquid-equivalent flow rate of about 800 mgm to about 1,600 mgm. Helium may be included as a carrier gas at a flow rate of about 600 sccm to about 2,400 sccm. An activated oxygen precursor may be introduced to the chamber at a flow rate between about 3 sLm and about 20 sLm.

The precursors react to deposit a flowable oxide layer, or insulator layer 118, on the substrate 100. The CVD process described above may be implemented on the PRODUCER® CVD system available from Applied Materials, Inc., of Santa Clara, Calif. However, it is contemplated that other chambers from other manufacturers may also perform the processes described.

Figure 8:
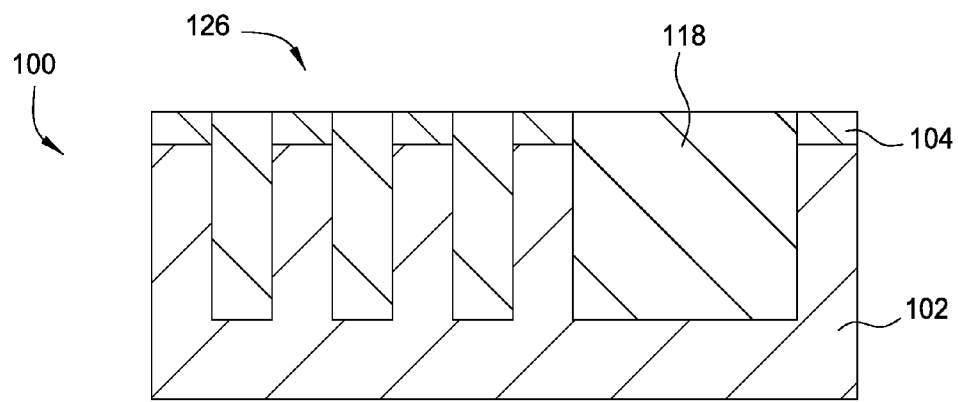

FIG. 8 is a cross-sectional view of the substrate 100 illustrating an insulator layer 118 chemical mechanical polishing/planarization (CMP) process. The previously deposited insulator layer 118 may have a non-uniform thickness across the substrate 100. A CMP process is utilized to planarize the top surface 126 of the substrate 100. The CMP process is performed to polish the top surface of the substrate 100 such that the insulator layer 118 is substantially co-planar with the hardmask layer 104. In this embodiment, the hardmask layer 104 may be utilized as a hard stop for the CMP process to determine a polishing end point. The CMP process may be implemented on the REFLEXION GT™ system or other similar systems available from Applied Materials, Inc., Santa Clara, Calif. However, it is contemplated that other chambers from other manufacturers may also perform the processes described.

Figure 9:
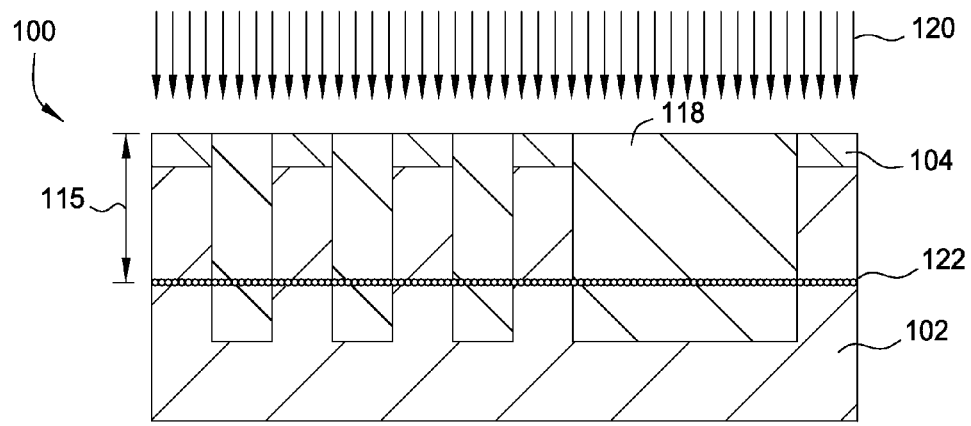

FIG. 9 is a cross-sectional view of the substrate 100 illustrating an ion implantation process. In one embodiment, the ion implantation process may be performed immediately after the planarization process described with regard to FIG. 8. In other embodiments, the ion implantation process may be performed on a virgin substrate prior to the hardmask layer 104 deposition process or after an oxide recess etch process described in greater detail with regard to FIG. 11.

In one embodiment, the ion implantation process is utilized to implant an n-type dopant, such as antimony, arsenic, or phosphorous, a desired depth into the substrate 100 to form an implanted region 122. For example, a low dose of n-type dopant may be implanted to a depth of between about 30 nm and about 400 nm from the top surface 126 of the substrate. The depth of the ions implanted into the substrate 100 and the corresponding implanted region 122 may correlate to an etch stop of a subsequent silicon etch process described in detail with regard to FIG. 12.

Figure 10:
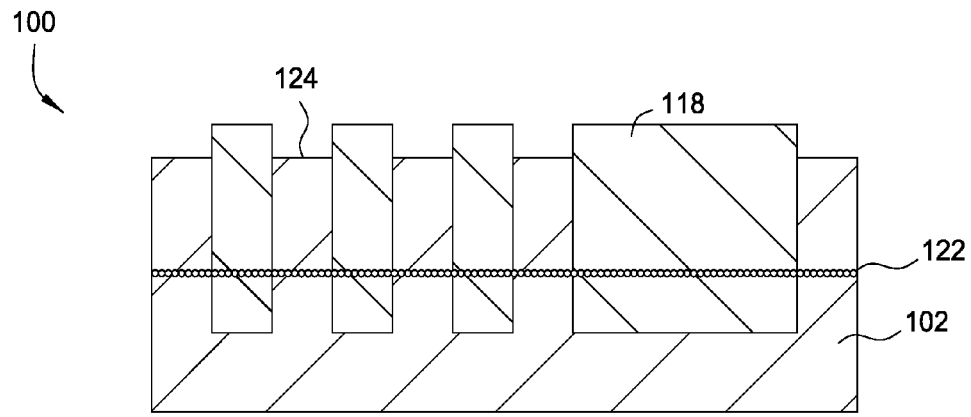

FIG. 10 is a cross-sectional view of the substrate 100 illustrating a hardmask layer 104 removal process. The hardmask layer 104 is removed after the ion implantation process to expose a feature 124 of the silicon layer 102. The hardmask layer 104 removal process may be performed by wet or dry etching processes similar to the examples provided with regard to FIG. 4. After the removal of the hardmask layer 104, the insulator layer 118 may extend beyond the feature 124.

Figure 11:
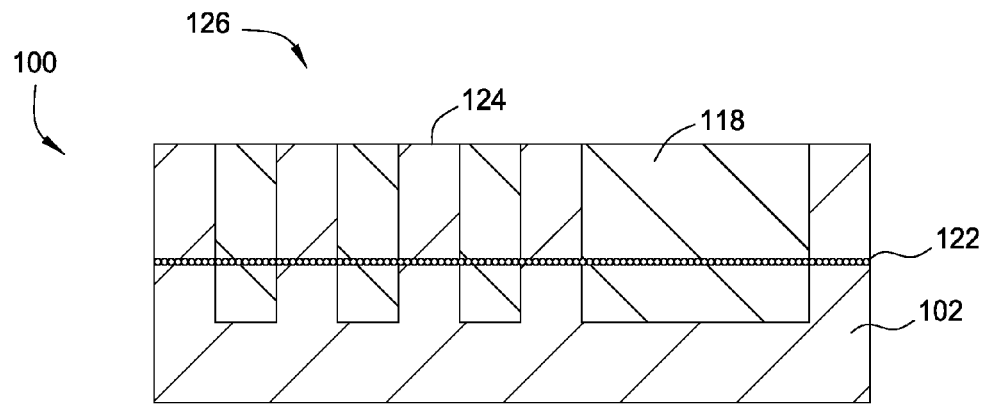

FIG. 11 is a cross-sectional view of the substrate 100 illustrating an insulating layer 118 recess etching process. The portions of the insulator layer 118 extending beyond the features 124 may be removed by an etching process to form the substantially planar top surface 126. The etching process may be either a wet etch or dry etch. In one example, the insulator layer 118 is etched utilizing a dry etch process with a chlorine containing plasma. A $CL_2$ precursor gas may be flowed at a rate of about 500 sccm in an environment having a pressure of about 7 mT. The $CL_2$ may be energized into a plasma with an RF power of about 1000 W and a bias of about 700 W and the etching process may proceed for about 45 seconds. As a result, the insulator layer 118 is etched to a height such that the insulator layer 118 and the features 124 are substantially co-planar. Thus, the top surface 126 of the substrate 100 is planarized.

Figure 12:
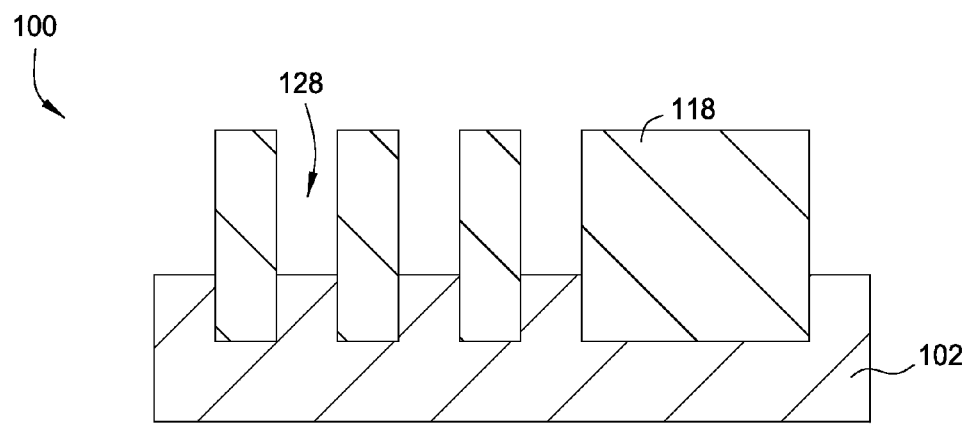

FIG. 12 is a cross-sectional view of the substrate 100 illustrating a silicon recess etching process. The features 124 of the silicon layer 102 are etched to form a trench 128 bounded by the insulator layer 118. In one example, the features 124 of the silicon layer 102 is etched utilizing a dry etch process with a chlorine containing plasma. A $CL_2$ precursor gas may be flowed at a rate of about 500 sccm in an environment having a pressure of about 7 mT. The $CL_2$ may be energized into a plasma with an RF power of about 1000 W and a bias of about 700 W and the etching process may proceed for about 45 seconds. The features 124 may be etched to a depth which corresponds to the implanted region 122. The resulting trench 128 has a base bottom comprising the silicon layer 102 and sidewalls comprising the insulator layer 118.

Figure 13:
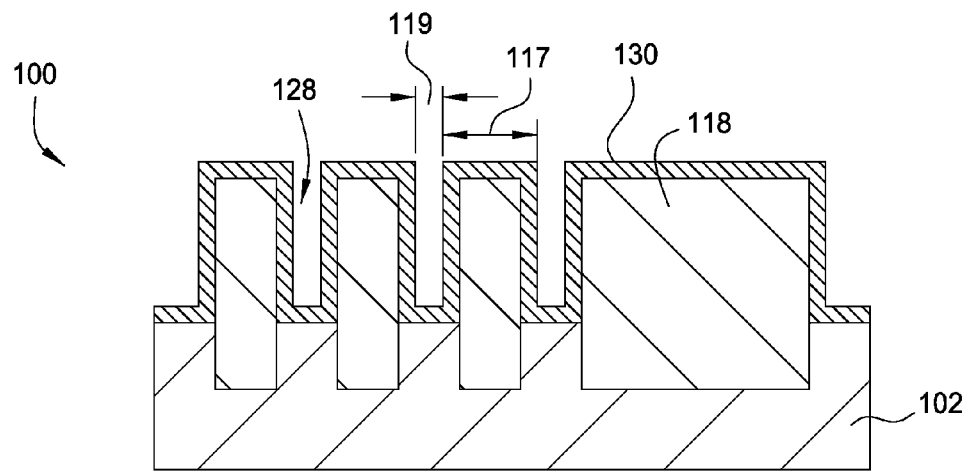

FIG. 13 is a cross-sectional view of the substrate 100 illustrating a conformal dielectric layer 130 formation process. The dielectric layer 130 is conformally deposited over the insulator layer 118 and the silicon layer 102. The dielectric layer 130 may comprise a silicon dioxide material, silicon nitride material, or other high-k dielectric material, and is deposited by an atomic layer deposition (ALD) process. The dielectric layer may also be deposited by a chemical vapor deposition (CVD) process. The dielectric layer 130 may have a thickness of about between about 5 nm and about 9 nm, such as about 6.5 nm. A width 117 of the dielectric layer 130 deposited over the insulator layer 118 may be between about 25 nm and about 40 nm, such as about 33 nm. The thickness of the dielectric layer 130 is chosen to reduce the dimensions of the trench 128 to form a desired width of a fin which is subsequently deposited in the trench 128. The dielectric layer 130 deposited in the trench 128 reduces the critical dimensions of the trench 128 such that a width 119 of the trench is between about 5 nm and about 10 nm, such as about 7 nm.

Figure 14:
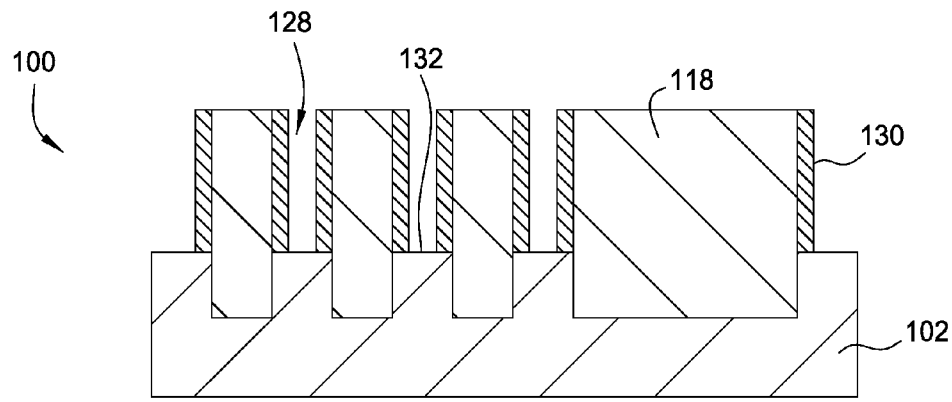

FIG. 14 is a cross-sectional view of the substrate 100 illustrating a dielectric layer 130 etching process. Portions of the dielectric layer 130 are removed during the etching process to expose a top the top surface 126 of the substrate 100 corresponding to the insulator layer 118 and a regrowth region 132 of the silicon layer 102. The dielectric layer 130 on the sidewalls of the insulator material 118 is not etched. The exposed regrowth region 132 may be slightly n-type doped as a result of the implantation region 122 formed in the ion implantation process previously described. A width of the regrowth region 132 may correspond to the width of the trench 128 having reduced critical dimensions described with regard to FIG. 13.

Figure 15:
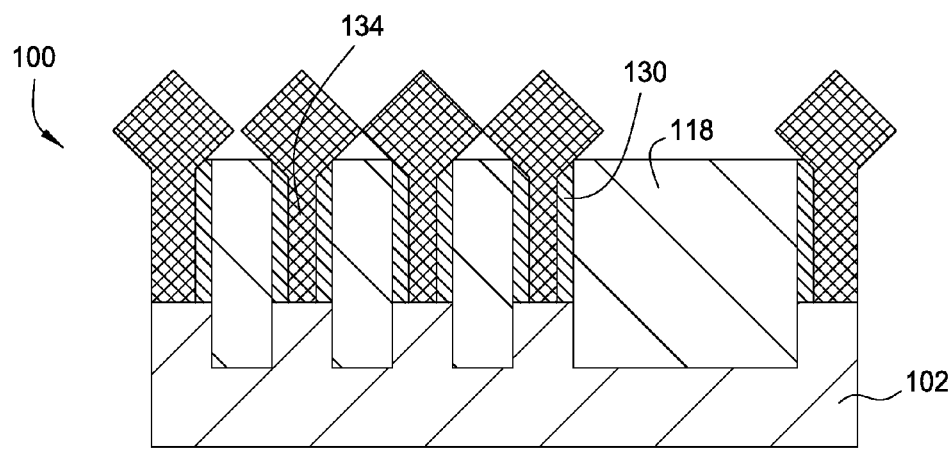

FIG. 15 is a cross-sectional view of the substrate 100 illustrating a fin structure 134 formation process. A semiconducting material, such as silicon, silicon germanium, compound semiconductor materials, and various other III-V materials, is deposited on the regrowth region 132 to form the fin structure 134. The fin structure 134 may be grown epitaxially from the regrowth region 132 away from the silicon layer 102. The material may be grown beyond the top surface 126 of the substrate 100. The fin structure 134 is bounded by the dielectric layer 130 from the silicon layer 102 to the top surface 126 of the substrate.

Figure 16:
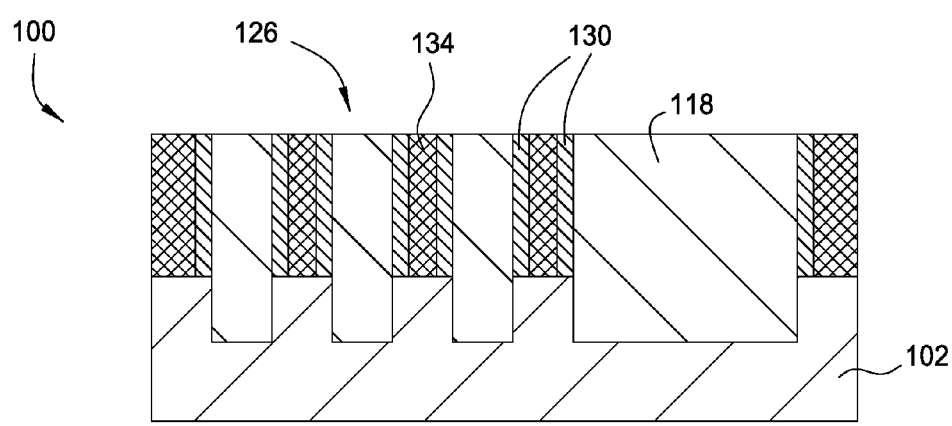

FIG. 16 is a cross-sectional view of the substrate 100 illustrating the substrate 100 planarization process. A CMP process is performed to remove the excess semiconductive material of the fin structure 134. The fin structure 134 is planarized such that the fin structure 134 is substantially co planar at the top surface 126 with the insulator material 118 and the dielectric layer 130. The resulting substrate 100 comprises the fin structure 134 bounded by the dielectric layer 130 which is bounded by the insulator material 118.

The fin structure 134 has a width of less than 10 nm, for example, about 7 nm, and an aspect ratio of the fin structure 134 is between about 5:1 and about 30:1. The fin structure 134 may be part of a FinFET structure formed on the substrate 100. The above methods provide for formation of a trench with a semiconducting fin formed therein with critical dimensions less than 10 nm.

In one embodiment, the methods described above are performed in sequence, however, it is contemplated that other processing steps may be utilized or that the processing steps may be performed in any order to achieve the resulting FinFET structure.

Figure 17:
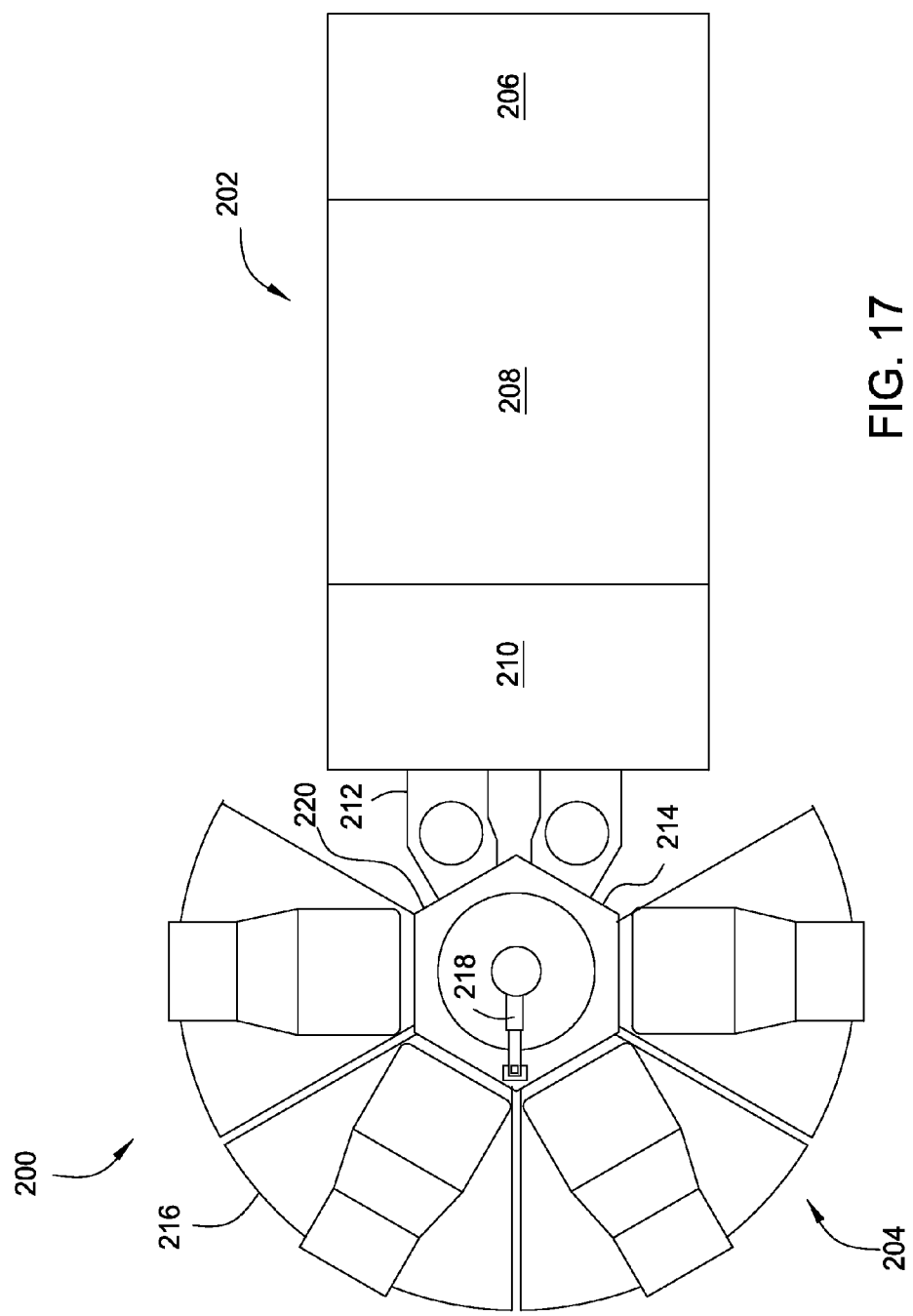
FIG. 17 is a schematic plan view of an apparatus which may be used to perform various processes described herein.

FIG. 17 is a schematic plan view of an apparatus 200 that may be utilized to perform the various processes described herein. The apparatus 200 comprises a substrate handling portion 202 and a substrate processing portion 204. The substrate handling portion 202 comprises a loading station 206, a transfer station 208, and an interface station 210. Substrates are loaded into the apparatus 200 at the loading station 206. In some cases, the loading operation may comprise disposing one or more substrates on a carrier for transport through the apparatus 200. The transfer station 208 moves substrates from the loading station 206 to the interface station 210. The transfer station 208 may comprise substrate handling features, such as flippers, if desired. The interface station 208 provides substrates to an entry load-lock chamber 212 for entry to the substrate processing portion 204, which generally operates under vacuum. The substrate processing portion 204 comprises a plurality of substrate processing chambers 216 coupled to a transfer chamber 220 with a transfer robot 218 disposed therein. Each of the processing chambers 516 may be an ALD chamber, a low temperature CVD chamber, a high-density plasma CVD chamber, a PECVD chamber, an etch chamber, a cure chamber, a plasma cleaning chamber, or an ion implantation chamber. In one embodiment, the chambers 516 include a plasma CVD chamber that forms a hardmask layer and/or a flowable oxide layer, and a plasma etch chamber that can etch silicon layers and oxide layers, The plasma CVD chamber may be an HDP CVD chamber, and the plasma etch chamber may be a remote plasma chamber with fluorine and oxygen precursors coupled thereto for oxide and silicon etching. An exit load-lock chamber 214 receives processed substrates for transfer back to the substrate handling portion 202.

In embodiments featuring a plurality of substrates disposed on a substrate carrier for processing, each of the processing chambers 216 may process a plurality of substrates at the same time. When the apparatus 200 is used to practice the methods described above, any or all of processes may be performed on a plurality of substrates simultaneously.

While the foregoing is directed to embodiments of the present disclosure, other and further embodiments of the disclosure may be devised without departing from the basic scope thereof, and the scope thereof is determined by the claims that follow.

What is claimed is:

1. A method of forming a semiconducting fin structure, comprising:
   etching a first layer to form a feature bounded by a first material;
   depositing a second layer over the first material and the feature formed in the first layer;
   etching the second layer to expose a portion of the first layer within the feature through the second layer; and
   forming a III-V material on the exposed portion of the first layer, the III-V material filling the feature between the second layer.

2. The method of claim 1, wherein the feature has an aspect ratio of between about 5:1 and about 30:1.

3. The method of claim 1, wherein the III-V material has a critical dimension of less than about 10 nm.

4. The method of claim 1, further comprising:
   removing a portion of the first material, the second layer, and the III-V material to form a planar surface.

5. The method of claim 1, wherein the first layer is a semiconductive material.

6. The method of claim 5, wherein the first material and the second layer are insulator materials.

7. The method of claim 6, wherein the second layer is conformally deposited over the first material and the feature formed in the first material.

8. A method of forming a semiconducting fin structure, comprising:
 etching a semiconductive layer to form a feature bounded by a first insulator material;
 depositing a second insulator material over the first insulator material and the feature formed in the semiconductive layer;
 etching the second insulator material to expose a portion of the semiconductive layer within the feature through the second insulator material; and
 forming a semiconducting material on the exposed portion of the semiconductive layer, the semiconducting material filling the feature between the second insulator material.

9. The method of claim 8, wherein the feature has an aspect ratio of between about 5:1 and about 30:1 and the semiconducting material has a critical dimension of less than about 10 nm.

10. The method of claim 8, further comprising:
 removing a portion of the first insulator material, the second insulator material, and the semiconducting material to form a planar surface.

11. The method of claim 8, wherein the second insulator material is conformally deposited over the first insulator material and the feature formed in the semiconductive layer.

12. The method of claim 8, further comprising:
 etching a first region of a photoresist layer to expose a first region of a neutral layer; and
 etching the exposed region of the neutral layer to expose a first region of a hardmask layer.

13. The method of claim 8, further comprising:
 etching a hardmask layer to expose a first region of the semiconductive layer; and
 etching the first region of the semiconductive layer to form a trench.

14. The method of claim 13, further comprising:
 depositing the first insulator material in the trench.

15. The method of claim 8, wherein the semiconducting material comprises a III-V material having a critical dimension of less than about 10 nm.

16. A method of forming a semiconducting fin structure, comprising:
 etching a silicon layer to form a feature bounded by an insulator material;
 depositing a dielectric layer over the insulator material and the feature formed in the silicon layer;
 etching the dielectric layer to expose a portion of the silicon layer within the feature through the dielectric layer; and
 forming a semiconducting material on the exposed portion of the silicon layer, the semiconducting material filling the feature between the dielectric layer.

17. The method of claim 16, wherein the feature has an aspect ratio of between about 5:1 and about 30:1 and the semiconducting material comprises a III-V material having a critical dimension of less than about 10 nm.

18. The method of claim 16, further comprising:
 removing a portion of the insulator material, the dielectric material, and the semiconducting material to form a planar surface.

19. The method of claim 16, wherein the dielectric layer is conformably deposited over the insulator material and the feature formed in the silicon layer.

20. The method of claim 16, further comprising:
 etching a first region of a photoresist layer to expose a first region of a neutral layer;
 etching the exposed region of the neutral layer to expose a first region of a hardmask layer;
 etching the exposed region of the hardmask layer to expose a first region of the silicon layer;
 etching a second region of the photoresist layer and a second region of the neutral layer to expose a second region of the hardmask layer;
 etching the first region of the silicon layer to form a trench;
 depositing the insulator material in the trench;
 planarizing the second region of the hardmask layer and the insulator material;
 implanting ions into a second region of the silicon layer and the insulator material; and
 etching the second region of the hardmask layer to expose the second region of the silicon layer.

\* \* \* \* \*

UNITED STATES PATENT AND TRADEMARK OFFICE
CERTIFICATE OF CORRECTION

| | | |
|---|---|---|
| PATENT NO. | : 9,553,147 B2 | Page 1 of 1 |
| APPLICATION NO. | : 14/673033 | |
| DATED | : January 24, 2017 | |
| INVENTOR(S) | : Ying Zhang et al. | |

It is certified that error appears in the above-identified patent and that said Letters Patent is hereby corrected as shown below:

In the Claims

In Column 10, Line 24, in Claim 19, delete "conformably" and insert -- conformally --, therefor.

Signed and Sealed this
Fourth Day of July, 2017

Joseph Matal
*Performing the Functions and Duties of the*
*Under Secretary of Commerce for Intellectual Property and*
*Director of the United States Patent and Trademark Office*